United States Patent
Kurokawa et al.

(10) Patent No.: US 10,425,010 B2
(45) Date of Patent: Sep. 24, 2019

(54) POWER CONVERSION DEVICE

(71) Applicant: KEIHIN CORPORATION, Shinjuku-ku, Tokyo (JP)

(72) Inventors: Kazunari Kurokawa, Oyama (JP); Takuma Kato, Sakura (JP); Takayuki Sasanuma, Hitachinaka (JP); Takeshi Kobayashi, Utsunomiya (JP); Yuta Nakamura, Utsunomiya (JP)

(73) Assignee: KEIHIN CORPORATION, Tokyo (JP)

( * ) Notice: Subject to any disclaimer, the term of this patent is extended or adjusted under 35 U.S.C. 154(b) by 0 days.

(21) Appl. No.: 16/229,181

(22) Filed: Dec. 21, 2018

(65) Prior Publication Data
US 2019/0260293 A1 Aug. 22, 2019

(30) Foreign Application Priority Data

Feb. 20, 2018 (JP) .................. 2018-027759

(51) Int. Cl.
*H02M 3/158* (2006.01)
*H02M 1/00* (2006.01)
*H02M 7/00* (2006.01)
H02P 27/06 (2006.01)
G01R 15/20 (2006.01)

(52) U.S. Cl.
CPC .......... *H02M 3/1582* (2013.01); *H02M 1/00* (2013.01); *H02M 7/003* (2013.01); *G01R 15/202* (2013.01); *H02M 2001/0009* (2013.01); *H02M 2003/1586* (2013.01); *H02P 27/06* (2013.01)

(58) Field of Classification Search
CPC ........... H02M 2001/009; H02M 7/003; H02M 3/1584; H02M 2003/1586; H02M 3/1588; G01R 15/202

See application file for complete search history.

(56) References Cited

U.S. PATENT DOCUMENTS

| 5,241,263 | A | * | 8/1993 | Naoi | G01R 15/202 324/117 H |
|---|---|---|---|---|---|
| 5,896,257 | A | * | 4/1999 | Takahashi | H02M 7/53875 361/23 |
| 6,459,255 | B1 | * | 10/2002 | Tamai | G01R 15/202 324/117 H |
| 2018/0120358 | A1 | * | 5/2018 | Nakayama | G01R 15/183 |
| 2018/0348261 | A1 | * | 12/2018 | Okamoto | G01R 15/202 |

FOREIGN PATENT DOCUMENTS

JP 2015198483 A 11/2015

* cited by examiner

*Primary Examiner* — Harry R Behm
(74) *Attorney, Agent, or Firm* — Cantor Colburn LLP

(57) ABSTRACT

A power conversion device includes a multiphase power conversion circuit, a plurality of bus bars which are arranged adjacent to each other, phase currents of the multiphase power conversion circuit flowing through the plurality of bus bars, respectively, a single current sensor configured to detect any of the phase currents in the plurality of bus bars, and a housing which houses the multiphase power conversion circuit, the plurality of bus bars and the current sensor, in which the current sensor includes a magnetic core through which the plurality of bus bars are inserted such that flow directions of the phase currents are the same direction, and which has a single magnetic gap, and a Hall element inserted in the magnetic gap.

5 Claims, 4 Drawing Sheets

POWER CONVERSION DEVICE

CROSS REFERENCE TO RELATED APPLICATION

The present application claims priority under 35 U.S.C. § 119 to Japanese Application No. 2018-027759, filed Feb. 20, 2018, the entire content of which is incorporated herein by reference.

BACKGROUND OF THE INVENTION

Description of Related Art

In vehicles such as electric vehicles or the like, a power control unit (PCU) is installed between a battery and a motor. A buck-boost converter that boosts a voltage output from the battery is provided in the power conversion device when a voltage higher than the battery voltage is required to drive the motor. For example, Patent Document 1 discloses a bidirectional DC/DC converter which is a two-phase buck-boost converter. This bidirectional DC/DC converter has two current sensors for detecting the current of each phase, and the switching operation is controlled based on the detected value of each current sensor.

[Patent Document 1] Japanese Unexamined Patent Application, First Publication No. 2015-198483

SUMMARY OF THE INVENTION

In the bidirectional DC/DC converter, since two current sensors are provided according to the number of phases, the number of parts increases and the cost also rises. In addition, in the bidirectional DC/DC converter, it is necessary to dispose the two current sensors in the current path of each phase, and further necessary to provide wires for each of the two current sensors, and therefore productivity is not good. Further, when there is a detection error in the two current sensors, variations occur in the current value, which influences the detection accuracy, and the current control becomes complicated.

Under such circumstances, it may be considered to reduce the number of current sensors, but in this case, sacrificing the current detection performance for each phase, which is the basic function of the current sensor, is undesirable as it would degrade the performance of the bidirectional DC/DC converter.

The present invention has been made in view of the above-mentioned circumstances, and it is an object of the present invention is to provide a power conversion device capable of reducing the number of current sensors more than a conventional, without sacrificing current detection performance.

A power conversion device according to one aspect of the present invention includes a multiphase power conversion circuit, a plurality of bus bars which are arranged adjacent to each other, phase currents of the multiphase power conversion circuit flowing through the plurality of bus bars, respectively, a single current sensor configured to detect any of the phase currents in the plurality of bus bars, and a housing which houses the multiphase power conversion circuit, the plurality of bus bars and the current sensor, in which the current sensor includes a magnetic core through which the plurality of bus bars are inserted such that flow directions of the phase currents are the same direction, and which has a single magnetic gap, and a Hall element inserted in the magnetic gap.

In the power conversion device according to one aspect, the magnetic core and the Hall element may be provided in the housing such that the positional relationship of the Hall element with respect to the magnetic gap becomes visible.

In the power conversion device according to one aspect, the housing may have an insertion hole into which the Hall element is inserted from one side, the position of the insertion hole corresponding to the magnetic gap, and the one side of the insertion hole may be formed in a tapered shape.

In the power conversion device according to one aspect, the power conversion device may further include a spacer inserted between the plurality of bus bars and configured to maintain a constant distance between the plurality of bus bars.

In the power conversion device according to one aspect, a positioning marker configured to assist with positioning of the Hall elements may be provided in the housing.

According to the present invention, a power conversion device capable of reducing the number of current sensors without sacrificing the current detection performance can be provided.

DETAILED DESCRIPTION OF THE INVENTION

First Embodiment

Hereinafter, a first embodiment of the present invention will be described with reference to FIG. 1 to FIG. 3B.

First, referring to FIG. 1, the circuit configuration (electrical configuration) of a PCU 1 according to the present embodiment will be described. The PCU 1 is a power conversion device mounted in a vehicle, which is driven using a motor (electric motor) as a power source, such as a hybrid vehicle or an electric vehicle. The motor includes a traction motor TRC-MOT and a generator motor GEN-MOT.

Figure 2:
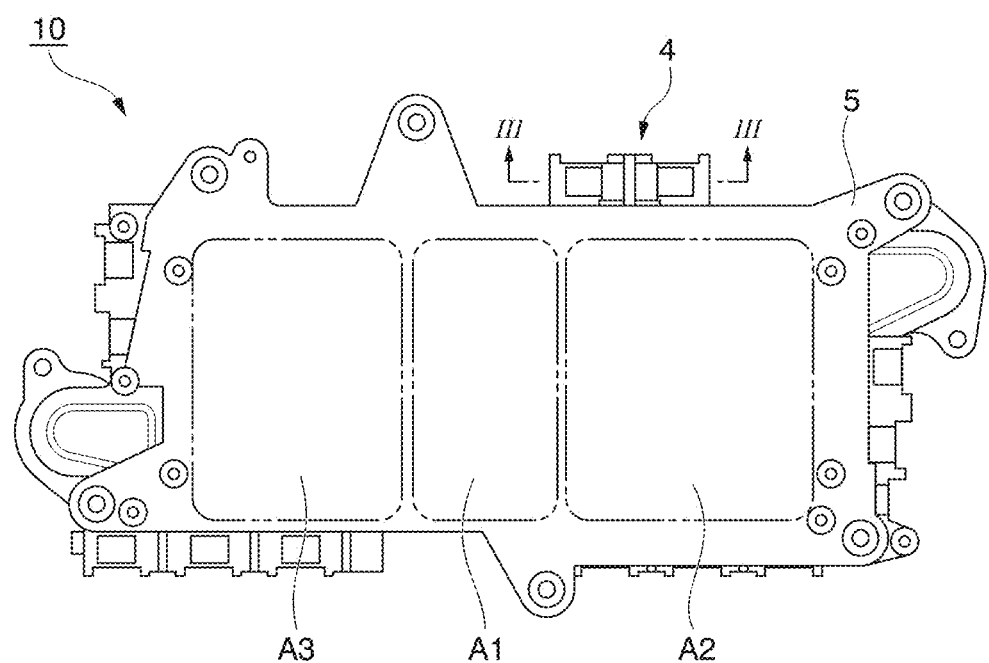
FIG. 2 is a front view of an IPM according to a first embodiment of the present invention.

The PCU 1 includes a buck-boost converter A1, a traction motor inverter A2 and a generator motor inverter A3. The buck-boost converter A1, the traction motor inverter A2 and the generator motor inverter A3 are arranged as a power module, and are configured into an integrated intelligent power module (IPM) 10, as shown in FIG. 2 which will be described later.

The buck-boost converter A1 steps up DC power input from a DC power source E and outputs it to the traction motor inverter A2 and the generator motor inverter A3. Further, the buck-boost converter A1 steps down DC power input from the traction motor inverter A2 and the generator motor inverter A3 and outputs it to the DC power source E. The buck-boost converter A1 includes a pair of reactors L1 and L2, a first power module P1, a second power module P2, a primary side capacitor C1, a secondary side capacitor C2, and a current sensor 4. This buck-boost converter A1 corresponds to a two-phase power conversion circuit (a multiphase power conversion circuit) of the present invention.

The first power module P1 has a pair of switching elements Q1 and Q2. The second power module P2 has a pair of switching elements Q3 and Q4.

For example, an insulated gate bipolar transistor (IGBT) may be used as the switching elements.

Figure 1:
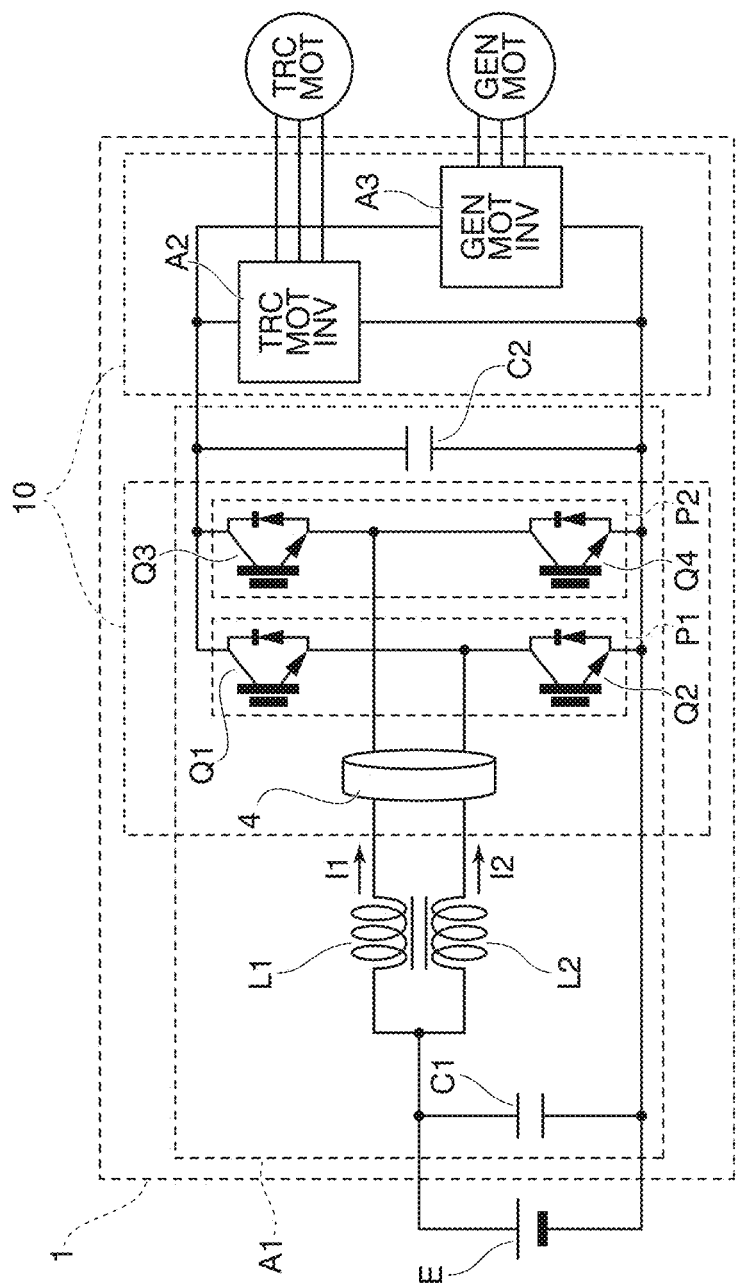
FIG. 1 is a circuit diagram of a PCU according to a first embodiment of the present invention.

As shown in FIG. 1, the buck-boost converter A1 is a two-phase buck-boost converter (two-phase power conversion circuit) having two parallel current paths. That is, one reactor L1 and one pair of switching elements Q3 and Q4 constitute one current path, and the other reactor L2 and the other pair of switching elements Q1 and Q2 constitute the other current path.

In these two current paths, the pair of switching elements Q1 and Q2 and the pair of switching elements Q3 and Q4 are operated by a control circuit (not shown) at different timings, so that alternating currents (a first phase current I1 and a second phase current I2) having different phases (for example, a phase difference of 180°) flow. That is, among the pair of reactors L1 and L2, the first phase current I1 flows in one reactor L1 and the second phase current I2 flows in the other reactor L2.

Here, since the buck-boost converter A1 operates as a two-phase buck-boost converter, the flow directions of the first phase current I1 and the second phase current I2 in the pair of reactors L1 and L2 are the same. That is, when the first phase current I1 flows from the DC power source E toward the second power module P2, the second phase current I2 also flows from the DC power source E toward the first power module P1.

Also, as shown in FIG. 1, the pair of reactors L1 and L2 in the buck-boost converter A1 are magnetically coupled to form a transformer. That is, in the pair of reactors L1 and L2, the first phase current I1 and the second phase current I2 are in a mutually influencing (electromagnetic induction) relationship.

The current sensor 4 is a single sensor that detects both the first phase current I1 and the second phase current I2 having the same flow direction. That is, the current sensor 4 detects the total current (sum current) of the first phase current I1 and the second phase current I2 and outputs it to the control circuit. Also, the control circuit controls ON/OFF of the pair of switching elements Q1 and Q2 and the pair of switching elements Q3 and Q4 based on the detection result of the current sensor 4.

The traction motor inverter A2 converts DC power input from the buck-boost converter A1 into AC power and supplies it to the traction motor. Further, the traction motor inverter A2 converts AC power (regenerative power) input from the traction motor into DC power and outputs it to the buck-boost converter A1. The generator motor inverter A3 converts DC power input from the buck-boost converter A1 into AC power and supplies it to the generator motor. Further, the generator motor inverter A3 converts AC power (generated power) input from the generator motor into DC power and outputs it to the buck-boost converter A1.

Figure 3A:
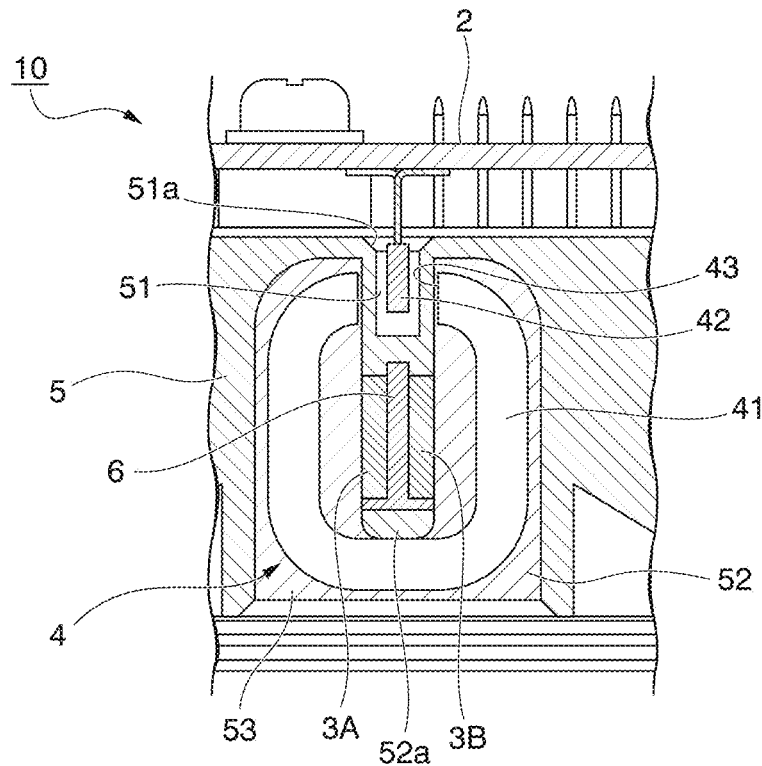
FIG. 3A is an enlarged view of a main part of an IPM according to a first embodiment of the present invention, and is a cross sectional view taken along the line of FIG. 2.
Figure 3B:
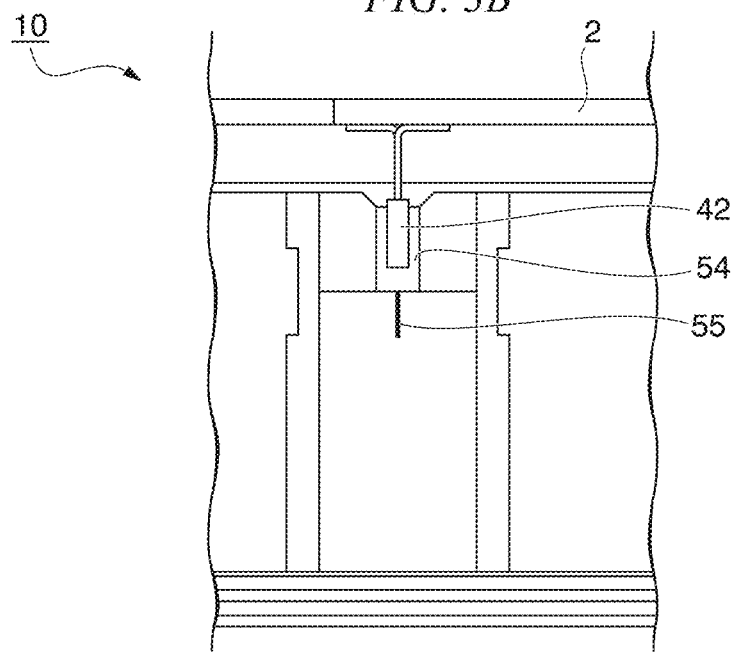
FIG. 3B is an enlarged side view of a main part of the IPM according to the first embodiment of the present invention.

Next, the mechanical configuration of the IPM 10 according to the present embodiment will be described with reference to FIG. 2 and FIG. 3A and FIG. 3B. FIG. 2 is a front view of the IPM 10. FIG. 3A and FIG. 3B are enlarged views of a main part of the IPM 10. FIG. 3A is a cross sectional view taken along the line of FIG. 2, and FIG. 3B is a side view of FIG. 2. In the following description, for the convenience of explanation, the vertical direction in FIG. 3A is defined as a vertical direction of the IPM 10, and the direction orthogonal to the vertical direction is defined as a horizontal direction of the IPM 10.

The IPM 10 includes at least a circuit board 2, a pair of bus bars 3A and 3B, the current sensor 4 and a housing 5. The circuit board 2 is fixedly disposed on an upper surface of the housing 5. The aforementioned control circuit is mounted on the circuit board 2. The circuit board 2 (control circuit) is connected to a host control device such as a vehicle control device or the like via a predetermined communication cable or the like, and controls the buck-boost converter A1, the traction motor inverter A2 and the generator motor inverter A3 based on control commands input from the host control device.

One bus bar 3A is a metal plate (for example, a copper plate) connecting one reactor L1 and the power module P2. The other bus bar 3B is a metal plate (for example, a copper plate) connecting the other reactor L2 and the power module P1. That is, one end of the bus bar 3A is connected to one reactor L1 and the other end of the bus bar 3A is connected to the power module P2. One end of the bus bar 3B is connected to the other reactor L2 and the other end of the bus bar 3B is connected to the power module P1.

Among the pair of bus bars 3A and 3B, the first phase current I1 flows through one bus bar 3A and the second phase current I2 flows through the other bus bar 3B. The pair of bus bars 3A and 3B are provided such that the flow directions of the first phase current I1 and the second phase current I2 are the same direction.

As shown in FIG. 3A, in the housing 5, the pair of bus bars 3A and 3B are adjacent to each other and disposed in parallel. A spacer 6 made of a resin for maintaining a constant distance between the pair of bus bars 3A and 3B is inserted between the pair of bus bars 3A and 3B.

As shown in FIG. 3A, the current sensor 4 includes a magnetic core 41 and a Hall element 42. The magnetic core 41 is a magnetic component provided on a side portion of the housing 5, and is formed in substantially a C shape having a magnetic gap 43. The pair of bus bars 3A and 3B are inserted through the magnetic core 41. Since the magnetic core 41 is made of a ferromagnetic material having a high magnetic permeability, magnetic lines of force generated around the pair of bus bars 3A and 3B due to the first phase current I1 and the second phase current I2 intensively flow in the magnetic core 41.

The Hall element 42 is mounted on one side of the circuit board 2 and is inserted into the magnetic gap 43 of the magnetic core 41. The Hall element 42 is a magnetic sensor which mainly detects the aforementioned magnetic lines of force passing through the magnetic gap 43. The current sensor 4 detects the sum current of the first phase current I1 and the second phase current I2 flowing through the pair of bus bars 3A and 3B, and outputs a detection signal to the control circuit separately mounted on the circuit board 2.

The housing 5 houses the power module of the buck-boost converter A1, the traction motor inverter A2 and the generator motor inverter A3. As shown in FIG. 3A and FIG. 3B, the housing 5 includes an insertion hole 51, a core insertion groove 52, and a slit 54. The insertion hole 51 extends downward from an upper surface of the housing 5. The insertion hole 51 is provided such that the position of the insertion hole 51 corresponds to the magnetic gap 43 when the magnetic core 41 is embedded in the housing 5. The Hall element 42 is inserted into the insertion hole 51 from one side (the upper side). An opening 51a of the insertion hole 51 is formed in a tapered shape gradually increasing in diameter toward one side (upward).

The core insertion groove 52 is provided at a lower portion of the housing 5 and opens downward. The magnetic core 41 is inserted into the core insertion groove 52 from the other side (the lower side). In this state, by filling the core insertion groove 52 with a resin 53, the magnetic core 41 is fixed in the housing 5. At a central portion of the core insertion groove 52 in the horizontal direction, a protruding portion 52a that is projected downward from a bottom surface of the core insertion groove 52 (that is, a top surface of the core insertion groove 52) is provided. The pair of bus bars 3A and 3B are fixed to the protruding portion 52a in a state where the space between the pair of bus bars 3A and 3B is kept constant by the spacer 6. The pair of bus bars 3A and 3B are integrally molded with the protruding portion 52a.

As shown in FIG. 3B, the slit 54 is provided on a side surface of the housing 5 and extends downward from the upper surface of the housing 5 when viewed from the side. The slit 54 communicates the insertion hole 51 and the side surface of the housing 5. That is, the slit 54 exposes the Hall element 42 toward an outside of the housing 5. Therefore, with the slit 54, the positional relationship of the Hall element 42 with respect to the magnetic gap 43 becomes visible from the outside of the housing 5. A positioning marker 55 for assisting with positioning of the Hall element 42 is formed below the slit 54 on the side surface of the housing 5.

In this IPM 10, the circuit board 2 on which the Hall element 42 and the control circuit are mounted is fixed to an upper portion of the housing 5, which holds the pair of bus bars 3A and 3B and the magnetic core 41 integrally, by using a predetermined fixture (a screw, etc.), whereby the Hall element 42 is positioned in the insertion hole 51 of the housing 5.

According to the present embodiment, since the pair of bus bars 3A and 3B are provided such that the flow directions of the first phase current I1 and the second phase current I2 are the same direction, it is possible to detect the sum current of the first phase current I1 and the second phase current I2 with the single current sensor 4. Therefore, without impairing the functionality of power control, over-current protection, etc., it is possible to integrate two current sensors, which were conventionally provided separately for each phase, into a single current sensor 4. Here, when the pair of bus bars 3A and 3B are provided such that the flow directions of the first phase current I1 and the second phase current I2 are opposite to each other, only the difference between the first phase current I1 and the second phase current I2 is detected. Accordingly, in this case, it is impossible to realize the function of overcurrent protection or the like.

Therefore, according to the PCU 1 of the present embodiment, it is possible to reduce the number of the current sensors 4 more than a conventional, without sacrificing the current detection performance of the current sensor 4.

In addition, although the positional relationship of the circuit board 2 with respect to the housing 5 may slightly vary due to fixtures or the like, according to the present embodiment, since the housing 5 is provided with the slit 54 and the positioning marker 55, the position of the Hall element 42 with respect to the insertion hole 51 can be confirmed before the circuit board 2 is finally fixed to the housing 5. Therefore, according to the present embodiment, it is possible to easily position the Hall element 42 with respect to the insertion hole 51, i.e., the magnetic gap 43 of the magnetic core 41, at a desired position.

Further, in the present embodiment, the housing 5 has the insertion hole 51 in which the Hall element 42 is inserted from one side, the position of the insertion hole 51 corresponds to the magnetic gap 43, and one side of the insertion hole 51 is tapered. Therefore, according to the present embodiment, it is possible to smoothly insert the Hall element 42 into the insertion hole 51.

In the present embodiment, the spacer 6 for keeping the distance between the pair of bus bars 3A and 3B constant is inserted between the pair of bus bars 3A and 3B. That is, according to the present embodiment, the pair of bus bars 3A and 3B can be fixed to the housing 5 with their distance kept constant. Therefore, since the positional relationship between the current sensor 4 and the pair of bus bars 3A and 3B can be kept constant, the first phase current I 1 and the second phase current I 2 can be stably detected by the current sensor 4.

Second Embodiment

Next, a second embodiment of the present invention will be described with reference to FIG. 4A and FIG. 4B. Also, in the present embodiment, the same or equivalent constituent parts are denoted by the same reference numerals as those of the first embodiment, and the explanation thereof may be omitted or simplified.

Figure 4A:
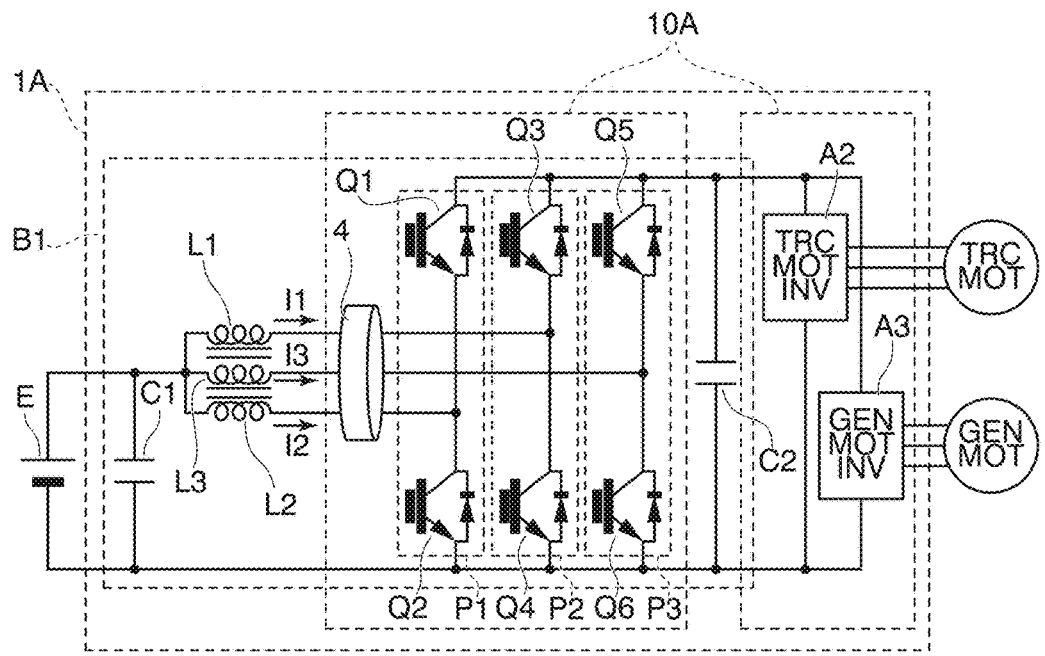
FIG. 4A is a circuit diagram of a PCU according to a second embodiment of the present invention.
Figure 4B:
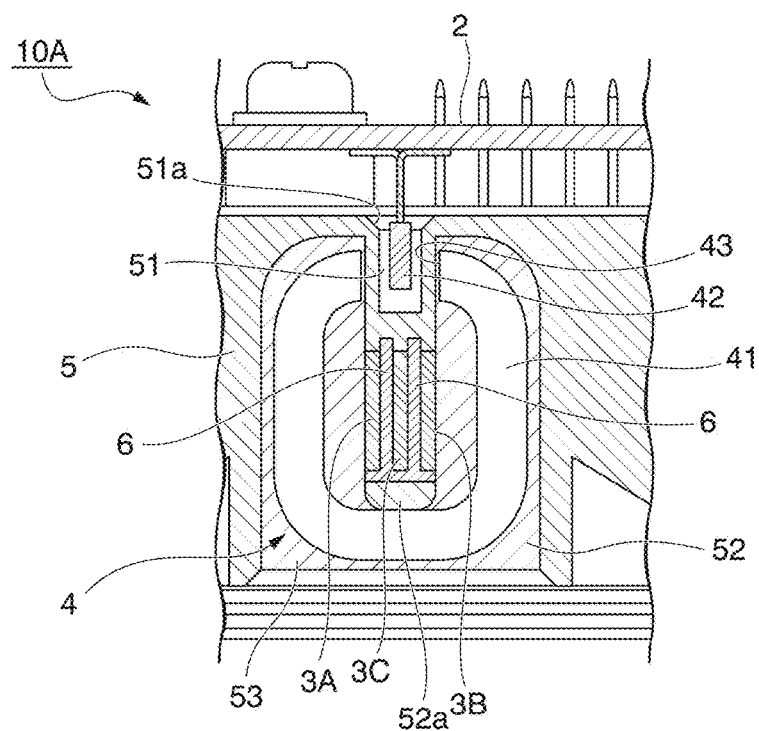
FIG. 4B is an enlarged cross sectional view of a main part of an IPM according to a second embodiment of the present invention.

FIG. 4A is a circuit diagram of a PCU 1A according to the present embodiment. FIG. 4B is an enlarged cross sectional view of a main part of an IPM 10A according to the present embodiment.

As shown in FIG. 4A, the PCU 1A of the present embodiment is different from the PCU 1 of the first embodiment in that, instead of the buck-boost converter A1 which is a two-phase power conversion circuit, the PCU 1A of the present embodiment includes a buck-boost converter B1 that is a three-phase power conversion circuit (a multiphase power conversion circuit). The buck-boost converter B1 includes three reactors L1, L2 and L3, the first power module P1, the second power module P2, a third power module P3, the primary side capacitor C1, the secondary side capacitor C2, and the current sensor 4. The third power module P3 includes a pair of switching elements Q5 and Q6.

The buck-boost converter B1 is a three-phase buck-boost converter (three-phase power conversion circuit) having three current paths disposed in parallel. That is, the reactor L1 and the pair of switching elements Q3 and Q4 constitute a first current path, the reactor L2 and the pair of switching elements Q1 and Q2 constitute a second current path, and the reactor L3 and the pair of switching elements Q5 and Q6 constitute a third current path.

In these three current paths, the pair of switching elements Q1 and Q2, the pair of switching elements Q3 and Q4, and the pair of switching elements Q5 and Q6 are operated at different timings by a control circuit (not shown), so that alternating currents (the first phase current I1, the second phase current I2, and third phase current I 3) having different phases (for example, phase differences of 120°) flow. That is, the first phase current I1 flows through the reactor L1, the second phase current I2 flows through the reactor L2, and the third phase current I3 flows through the reactor L3.

The current sensor 4 detects any of the first phase current I1, the second phase current I2, and the third phase current I3 having the same flow direction. That is, the current sensor 4 detects the total current (sum current) of the first phase current I1, the second phase current I2, and the third phase current I3 and outputs it to the control circuit. The control circuit controls ON/OFF of the pair of switching elements Q1 and Q2, the pair of switching elements Q3 and Q4 and the pair of switching elements Q5 and Q6 based on the detection result of the current sensor 4.

Next, with reference to FIG. 4B, a mechanical configuration of the IPM 10A according to the present embodiment will be described. The IPM 10A of the present embodiment is different from the IPM 10 of the first embodiment in that the IPM 10A further includes a bus bar 3C. That is, the IPM 10A includes at least the circuit board 2, the three bus bars 3A, 3B and 3C, the current sensor 4 and the housing 5. The bus bar 3C is a metal plate (for example, a copper plate) connecting the reactor L3 and the power module P3. One end of the bus bar 3C is connected to the reactor L3, and the other end of the bus bar 3C is connected to the power module P3. The third phase current I3 flows through the bus bar 3C. In addition, the bus bars 3A, 3B and 3C are provided such that the flow directions of the first phase current I1, the second phase current I2 and the third phase current I3 are the same direction.

In the housing 5, the bus bars 3A, 3B and 3C are adjacent to each other and arranged in parallel. Spacers 6 made of a resin for keeping the distance between the bus bars 3A, 3B and 3C constant are inserted between the bus bars 3A, 3B and 3C. Further, the bus bars 3A, 3B and 3C are inserted through the magnetic core 41 of the current sensor 4. The current sensor 4 detects the sum current of the first phase current I1, the second phase current I2, and the third phase current I3 flowing through the bus bars 3A, 3B and 3C, and outputs a detection signal to the control circuit separately mounted on the circuit board 2.

According to the present embodiment, since the bus bars 3A, 3B and 3C are provided such that the flow directions of the first phase current I1, the second phase current I2 and the third phase current I3 are the same direction, the sum current of the first phase current I1, the second phase current I2 and the third phase current I3 can be detected with the single current sensor 4. Therefore, it is possible to integrate three current sensors, which were conventionally provided separately for each phase, into the single current sensor 4 without impairing the function of power control, overcurrent protection or the like. As a result, according to the PCU 1A of the present embodiment, similarly to the PCU 1 of the first embodiment, it is possible to reduce the number of the current sensors 4 more than a conventional, without sacrificing the current detection performance of the current sensor 4.

It should be understood that the present invention is not limited to the aforementioned embodiments described with reference to the drawings, and various modifications are conceivable within the technical scope thereof.

For example, although the slit 54 and the positioning marker 55 are provided to confirm the position of the Hall element 42 with respect to the magnetic gap 43 in the above embodiments, the present invention is not limited thereto. For example, instead of the slit 54 and the positioning marker 55, the position of the Hall element 42 may be identified by energization.

Although one side of the insertion hole 51 is formed in a tapered shape in the above embodiments, the present invention is not limited thereto. One side of the insertion hole 51 may not be tapered.

Although the spacer 6 is inserted between the pair of bus bars 3A and 3B in the above embodiments, the present invention is not limited thereto. The spacer 6 may be omitted.

Although the reactors L1, L2 and L3 are magnetically coupled to each other in the above embodiments, the present invention is not limited thereto. The power conversion device of the present invention is also applicable to power conversion circuits other than magnetically coupled reactors.

Although the PCU 1 includes the buck-boost converter A1, the traction motor inverter A2 and the generator motor inverter A3 in the above embodiments, the present invention is not limited thereto. The configuration may be provided such that the PCU 1 includes the buck-boost converter A1 and the traction motor inverter A2, or only the buck-boost converter A1.

The magnetic core 41 of the current sensor 4 is fixed by potting in the above embodiments, but insert molding may also be applied.

Further, within the scope not departing from the spirit of the present invention, it is possible to appropriately replace the constituent elements in the above embodiments with well-known constituent elements, and the aforementioned modifications may be appropriately combined.

What is claimed is:

1. A power conversion device comprising:
a multiphase power conversion circuit;
a plurality of bus bars which are arranged adjacent to each other, phase currents of the multiphase power conversion circuit flowing through the plurality of bus bars, respectively;
a single current sensor configured to detect any of the phase currents in the plurality of bus bars; and
a housing which houses the multiphase power conversion circuit, the plurality of bus bars and the current sensor,
wherein the current sensor includes:
a magnetic core through which the plurality of bus bars are inserted such that flow directions of the phase currents are the same direction, and which has a single magnetic gap; and
a Hall element inserted in the magnetic gap.

2. The power conversion device according to claim 1, wherein the magnetic core and the Hall element are provided in the housing such that the positional relationship of the Hall element with respect to the magnetic gap is visible.

3. The power conversion device according to claim 1, wherein the housing has an insertion hole into which the Hall element is inserted from one side, the position of the insertion hole corresponding to the magnetic gap, and
the one side of the insertion hole is formed in a tapered shape.

4. The power conversion device according to claim 1, further comprising
a spacer inserted between the plurality of bus bars and configured to maintain a constant distance between the plurality of bus bars.

5. The power conversion device according to claim 1, wherein a positioning marker configured to assist with positioning of the Hall elements is provided in the housing.

* * * * *